United States Patent [19]
Hofmeister et al.

[11] Patent Number: 5,170,330
[45] Date of Patent: Dec. 8, 1992

[54] CIRCUIT BOARD STRUCTURE FOR AT LEAST TWO DIFFERENT COMPONENT TYPES

[75] Inventors: Werner Hofmeister, Muehlacker; Helmut Schildhauer, Stuttgart, both of Fed. Rep. of Germany

[73] Assignee: Robert Bosch GmbH, Stuttgart, Fed. Rep. of Germany

[21] Appl. No.: 799,009

[22] Filed: Nov. 25, 1991

Related U.S. Application Data

[63] Continuation of Ser. No. 547,022, Jun. 29, 1990.

[30] Foreign Application Priority Data

Aug. 3, 1989 [DE] Fed. Rep. of Germany ....... 3925648

[51] Int. Cl.⁵ .............................................. H01R 9/00
[52] U.S. Cl. ..................................... 361/406; 333/12; 361/395; 361/413; 439/79
[58] Field of Search ............... 174/35 C, 35 R, 35 TS, 174/254, 261; 333/12; 361/392, 395, 399, 406, 413, 422, 424; 439/59, 60, 62, 74, 79, 80, 607, 609, 610, 620; 307/89, 90, 91, 147, 327, 10.1, 9.1

[56] References Cited

U.S. PATENT DOCUMENTS 4,603,320  7/1986  Farago ................................... 439/79
4,668,873  5/1987  Ohba et al. ........................... 361/395
4,686,506  8/1987  Farago ................................... 439/79

FOREIGN PATENT DOCUMENTS 3628281  3/1988  Fed. Rep. of Germany .

OTHER PUBLICATIONS

World Patents Index abstract No. 88-064985/10 of STOLLFUSS laid-open application DE-OS 36 28 981.
Robert Bosch GmbH Flyer "Elektronische Steuergeräte", 1984, No. Z5W-K8/184-1D-1987 70 9001.

Primary Examiner—Leo P. Picard
Assistant Examiner—D. Sparks
Attorney, Agent, or Firm—Frishauf, Holtz, Goodman & Woodward

[57] ABSTRACT

A circuit board structure, particularly adapted for use in motor vehicle control devices, features a PC board 1 with two different electronic assemblies, e.g. a power portion 5 and a control portion 4, mounted thereon. A card-edge 9 supports a card-edge connector 10 which is connected by leads 8 to a plurality of terminals 7 arranged intermediate the two assemblies 2, 3. In order to enhance electromagnetic compatibility, the terminals 7 are connected to card-edge connector 10 by means of L-shaped leads 8 which bridge over one of the two assemblies, preferably the power portion or assembly.

6 Claims, 2 Drawing Sheets

CIRCUIT BOARD STRUCTURE FOR AT LEAST TWO DIFFERENT COMPONENT TYPES

This application is a continuation of application Ser. No. 07/547,022, filed Jun. 29, 1990.

The present invention relates generally to a circuit board structure adapted for mounting of at least two different types of assemblies, for example control types and power types, and, more particularly, to a structure which facilitates bridging conductors from components mounted on the board or card edge to contacts forming part of tracks away from the edge.

BACKGROUND

It is conventional to mount multiple electronic assemblies on a single PC (printed circuit) board or card. These components can perform differing functions, so that they often are driven with correspondingly differing voltages. This can lead to problems with respect to electromagnetic compatibility (EMC), that is, to emission and reception of electromagnetic noise radiation which degrades functionality. This is particularly the case when the differing components are a control assembly and a power assembly. The aforementioned problems of electromagnetic compatibility arise because high voltages and current are present in the power assembly, and these can easily influence the lower voltages and currents present in the control assembly. Since the card-edge connector must generally connect with both assemblies, and its contacts are on the card edge, substantial common or adjacent routing of power leads or tracks and control leads or tracks seems unavoidable. This leads to cross-coupling or interference phenomena, and thus negatively affects electromagnetic compatibility.

THE INVENTION

Accordingly, a primary object of the present invention is to minimize or eliminate reciprocal electromagnetic noise influences among the various assemblies on the PC board.

Briefly, the respective types of components are consolidated into separate assemblies; that is, they are arranged, in planar configuration, apart from each other. In a border region intermediate two assemblies, terminals are provided for connection to a card-edge connector via a plurality of leads. The terminals are connected by tracks to the power, portion or assembly and to the remainder of the circuit, which may be a control portion, for example a digital control portion. One of the assemblies is bridged over or spanned by the leads from the terminals to the card-edge connector.

This reduces to a minimum common routing of conductors of the respective assemblies, so that harmful cross-couplings and stray pulses are avoided. The planar arrangement and separation of the respective assemblies contributes to better electromagnetic compatibility. Further, the arrangement of the present invention leads to more compact construction and permits good heat dissipation, e.g. to the device housing.

Due to the spanning over of one of the assemblies by the leads, the terminals are spaced from the connector mounted on the card-edge. Preferably, the terminals define at least one terminal row which runs parallel to the longitudinal extent of the card-edge connector. This structure assures that the individual leads, required by prior art designs which scattered components around the board, are avoided.

In a preferred embodiment, two parallel-running terminal rows are provided, each electrically connected to its respective adjacent assembly of components. This maintains separation of the individual assemblies also with respect to terminals and assures short conductor paths.

The bridging or spanning of one assembly is preferably accomplished by means of L-shaped leads. These each have one end connected to a PC board terminal, extending normal to the board and another, angled off, end running parallel to the plane of the board into the contacts of the card-edge connector.

Preferably, the bridged-over assembly is the power portion and the other portion is the control portion of the circuit.

Preferably, the power portion and control portion form part of an electronic control device of a motor vehicle; thus, the invention has application in the field of vehicular on-board electronics.

DRAWINGS

These features are explained below with reference to the figures, of which:

DETAILED DESCRIPTION

Figure 1:
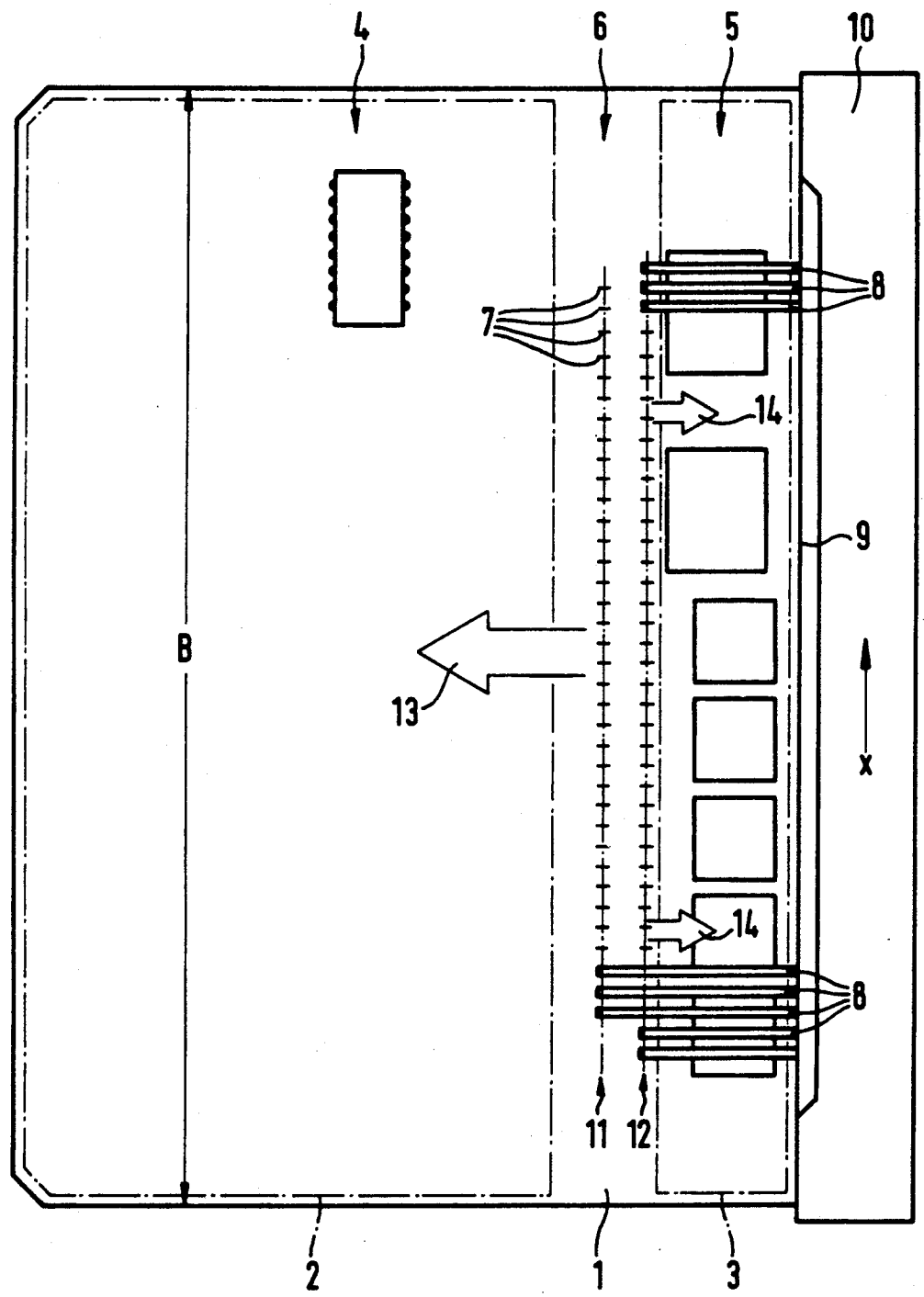
FIG. 1 is a top view of a circuit board.

FIG. 1 illustrates a PC board 1, which may, for example, be a metal-core PC board. It has mounted on it a first electronic assembly 2, indicated only generally, and a further, second electronic assembly 3. In the preferred embodiment, PC board 1 forms part of an electronic control device of a motor vehicle's electronics, which includes a control portion 4 and a power portion 5.

Control portion 4 is arranged on PC board 1 in a generally planar configuration as first assembly 2 and power portion 5 is arranged in a generally planar configuration as second assembly 3. Thus, these two functional assemblies are separated from one another. Between them, in border zone 6, are various terminals 7 which are indicated only schematically in FIG. 1. Terminals 7 are defined by ends of PC board conductive tracks which penetrate the terminal zone.

Preferably, terminals 7 feature through-holes, so that leads 8 can have their ends stuck into the holes and soldered to terminals 7. The other ends of leads 8 lead to contacts of a card-edge connector 10 mounted on card-edge 9 of board 1.

Terminals 7 of border zone 6 define two parallel-running terminal rows 11, 12 which extend parallel to the longitudinal axis X of card-edge connector 10. The arrangement is configured so that card-edge connector 10 is adjacent second assembly 3, which preferably extends over the entire breadth B of PC board 1 and thus defines the power portion 5 of the control device. Adjacent to that is the border zone 6 which features the parallel-running terminal rows 11 and 12. Thereafter comes first assembly 2 which includes the control portion 4 of the control device.

Connections to the contacts 7 of the two terminal rows 11 and 12 are made in such a way that terminal row 11, adjacent control portion 4, connects essentially with first assembly 2, and that power portion 5 connects essentially with contacts 7 of the neighboring or adjacent terminal row 12, in each case via corresponding tracks of PC board 1. This is indicated, on the one hand, by arrow 13, and on the other hand by the two arrows 14 in FIG. 1.

Figure 2:
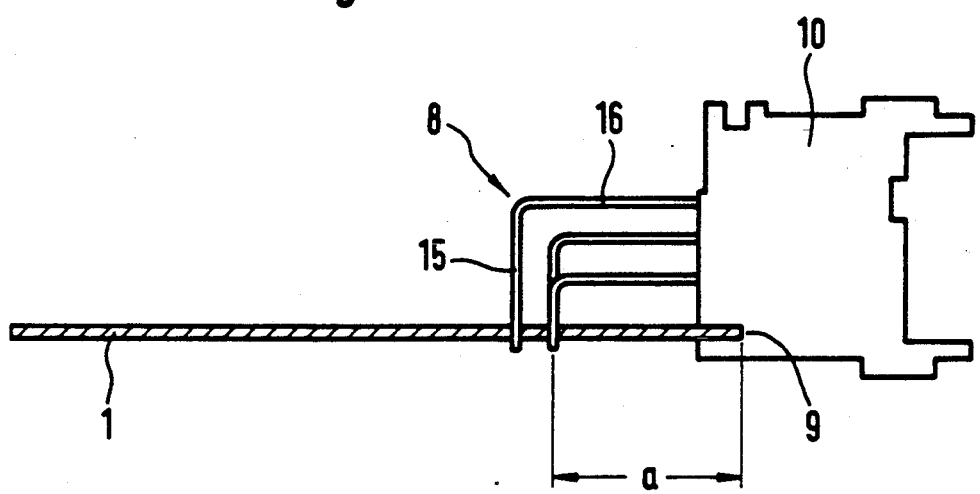
FIG. 2 is a cross-sectional view of a board or card.

As shown in FIG. 2, leads 8 are preferably L-shaped, each having a first leg 15 running normal to the plane of PC board 1, and a second angled-off leg 16 running parallel to the plane of PC board 1.

Terminal row 12 is located at a spacing a from card-edge 9 which suffices to accomodate power portion 5 underneath leads 8. Thus, leads 8 span over second assembly 3 without touching.

The arrangement of leads 8 is preferably carried out in such a way that adjacent leads 8 connect to correspondingly selected components of both assemblies 2 and 3 so that reciprocal or opposite noise influences minimize each other and cross-coupling possibilities are further minimized.

Preferably, the spacing a between card-edge 9, supporting connector 10, and the terminals 7 is on the order of one-half to four centimeters.

We claim:

1. Circuit board structure, comprising
   a printed circuit card (1) having a card-edge (9) on which is mounted a card-edge connector (10);
   a first assembly (2) of electronic compounds (4), of a control circuit consisting exclusively of a control type, operating at digital control voltages, mounted on said card;
   a second assembly (3) of electronic components (5), of said control circuit consisting exclusively of a power type, operating at higher voltages and currents than said control type components (4), mounted on said card;
   an intermediate zone including a plurality of terminals (7) separating said first and second assemblies (2, 3) from each other; and
   means for reducing cross-coupling and interference among respectively leads from said first assembly (2) and from said second assembly (3) to said card-edge connector (1), namely a plurality of leads (8) at two different longitudinal levels, each having an end connected to a respective one of said terminals (7) and bridging over components of said power assembly to said card-edge connector, thereby separating lead assocaited with said first assembly from said higher voltages and currents of said second assembly, whereby the terminals of the second assembly are directly connected to said card-edge connector (10).

2. Structure according to claim 1, wherein
   said terminals (7) are disposed at a minimum spacing a from said card-edge (9) adapted form mounting of said card-edge connector (10).

3. Structure according to claim 1, wherein said terminals (7) define at least one terminal row (11, 12) extending essentially parallel to a longitudinal extent of said card-edge connector (10).

4. Structure according to claim 1,
   wherein at least two terminals rows (11, 12) are provided, extending parallel to each other, and connected electrically essentially to respective adjacent ones of said assemblies.

5. Structure according to claim 1,
   wherein said bridging leads (8) are essentially L-shaped.

6. Structure according to claim 1,
   wherein said power assembly (5) and said control assembly (4) form part of an electronic control device for a motor vehicle.

* * * * *